United States Patent
Jin et al.

(10) Patent No.: US 7,333,784 B2
(45) Date of Patent: Feb. 19, 2008

(54) METHOD AND APPARATUS FOR COMPENSATING CODE CHANNEL POWER IN A TRANSMITTER

(75) Inventors: Xin Jin, Nepean (CA); Wen Zhao, Kanata (CA); Qingzhong Jiao, Nepean (CA)

(73) Assignee: Research in Motion Limited, Waterloo, Ontario (CA)

( * ) Notice: Subject to any disclaimer, the term of this patent is extended or adjusted under 35 U.S.C. 154(b) by 546 days.

(21) Appl. No.: 10/760,060

(22) Filed: Jan. 16, 2004

(65) Prior Publication Data

US 2005/0159118 A1    Jul. 21, 2005

(51) Int. Cl.
 *H04B 1/04*  (2006.01)
(52) U.S. Cl. .............................. 455/127.2; 455/258.1; 375/345; 370/336
(58) Field of Classification Search ............... 455/103, 455/127.1, 127.2, 232.1, 244.1, 245.1, 250.1, 455/522, 561, 234.1; 370/318, 336, 337, 370/347; 375/345, 295, 296
See application file for complete search history.

(56) References Cited

U.S. PATENT DOCUMENTS

| | | | |
|---|---|---|---|
| 5,715,526 A | 2/1998 | Weaver, Jr. et al. | |
| 5,745,521 A * | 4/1998 | Sugita | 375/147 |
| 6,480,481 B1 * | 11/2002 | Park et al. | 370/342 |
| 6,553,018 B1 * | 4/2003 | Ichihara | 370/342 |
| 6,690,944 B1 * | 2/2004 | Lee et al. | 455/522 |
| 6,694,148 B1 * | 2/2004 | Frodigh et al. | 455/522 |
| 7,062,289 B2 * | 6/2006 | Shu et al. | 455/522 |
| 2001/0010684 A1 * | 8/2001 | Willenegger et al. | 370/311 |
| 2003/0078010 A1 | 4/2003 | Davis | |
| 2003/0092462 A1 | 5/2003 | Dartois | |
| 2005/0135312 A1 * | 6/2005 | Montojo et al. | 370/335 |

* cited by examiner

*Primary Examiner*—Edward F. Urban
*Assistant Examiner*—Nhan T Le

(57) ABSTRACT

It has now been found that in some transmitter implementations which transmit multiple code channels, for example CDMA transmitters, the observed power for each code channel at the output relative to the other code channels is dependent upon the total transmit power due to non-linearities in the transmitter. Methods and apparatus are provided which use pre-set digital gains or digital gain adjustments to compensate for the non-linearities as a function of total transmit power such that at the output, the desired relative powers are observed.

24 Claims, 5 Drawing Sheets

METHOD AND APPARATUS FOR COMPENSATING CODE CHANNEL POWER IN A TRANSMITTER

FIELD OF THE INVENTION

The invention relates to methods and apparatus for compensating the code channel power in a transmitter, for example for compensating code channel powers in a CDMA transmitter.

BACKGROUND

Many communications standards require accurate regulation of transmitted power. This regulation depends in some cases not only upon the total radio link power, but also on data rates and signal formats. As an example, the CDMA 2000 standard has defined requirements for accurate transmit power control such as open loop and closed loop power control in the reverse link. These requirements also define relative code channel power requirements for each of the multiple code channels (for example pilot, FCH (Fundamental Channel), SCH (Supplemental Channel), DCCH (Dedicated Control Channel)) according to their data rates and signal formats. A detailed breakdown of the actual requirements for CDMA 2000 can be found in section 2.1.2 of IS-2000 hereby incorporated by reference in its entirety.

However, these kinds of requirements are not unique to IS-2000. Many other communication standards also have similar requirements for relative code channel powers. A few examples of other standards which include such requirements are 3GPP UMTS, 3GPP2 1xEVDO.

Conventional arrangements for implementing power control in such multiple code channel systems feature a controller which, in the digital domain, determines a gain for each of the channels which is to be active at a given time, subject to the relative code channel power requirement. These gains are then used to control digital gain elements. The outputs of the digital gain elements are combined, and normalized such that the sum of the channels has a more or less constant overall power. The output of the normalizer is then subject to further digital and RF processing before transmission. If the values of the individual digital gains provide a normalized total combined power, the digital portion of the transmitter does not need to include the normalizer.

SUMMARY OF THE INVENTION

According to one broad aspect, the invention provides a method in a transmitter having an output comprising: determining a current total transmit power for the output; determining a set of digital gains in response to the current total transmit power; applying the set of digital gains to a corresponding set of code channels, the set of digital gains setting relative powers of the set of code channels and also compensating for non-linearities in the transmitter as a function of the current total transmit power such that a desired relationship between channel powers of said set of channels after having been combined to produce the output is substantially achieved; combining the set of channels to produce the output.

In some embodiments, the desired relationship between channel powers comprises a specified relative power for each of the channels in the output.

In some embodiments, the method further comprises for each of at least one channel: maintaining a respective pre-set digital gain value for the channel for each of a plurality of states of the set of channels, and as a function of total transmit power; wherein the digital gain to be applied to the channel as part of said set of digital gains comprises the pre-set digital gain for the current state of the set of channels, and for the current total transmit power.

In some embodiments, for each of said at least one channel, a respective pre-set digital gain is maintained for each of the plurality of states of the set of channels and for a plurality of ranges of total transmit power.

In some embodiments, the method further comprises for each code channel: maintaining a respective pre-set digital gain value for the code channel for each of a plurality of states of the set of code channels, and for each of a plurality of ranges of total transmit power; wherein the digital gain to be applied to the code channel as part of said set of digital gains comprises the pre-set digital gain for a current state of the set of code channels, and for the range containing the current total transmit power.

In some embodiments, each state comprises a selection of a particular set of code channels from a set of possible code channels, and a selection of at least one of an encoding format, a signal format, and a data rate for at least one of the set of particular code channels.

In some embodiments, each state comprises at least one of: a selection of a particular set of code channels from an available set; a selection of a particular encoder format for at least one code channel; a selection of a particular signal format for at least one code channel; and a selection of a particular data rate for at least one code channel.

In some embodiments, the method comprises: for each state and for each code channel: maintaining the pre-set digital gains in a table mapping each range of transmit power to a respective pre-set digital gain.

In some embodiments, for each of at least one of the code channels determining a digital gain of said set of digital gains comprises: determining a nominal digital gain for the code channel; determining a gain adjustment for the code channel in response to the current total transmit power; combining the nominal digital gain and the gain adjustment to produce the digital gain of said set of digital gains for the code channel.

In some embodiments, the gain adjustment is a multiplicative gain adjustment, wherein combining the nominal digital gain and the gain adjustment to produce the respective digital gains comprises multiplying the nominal digital gain by the gain adjustment.

In some embodiments, the gain adjustment is an additive gain adjustment, wherein combining the nominal digital gain and the gain adjustment to produce the respective digital gains comprises adding the nominal digital gain with to gain adjustment.

In some embodiments, the method comprises: for each state and for each code channel: maintaining the gain adjustments in a table mapping each range of transmit power to a respective gain adjustment.

In some embodiments, each gain adjustment is pre-determined to provide compensation over a range of nominal digital gains.

In some embodiments, the code channels are CDMA code channels.

According to another broad aspect, the invention provides a transmitter having an output and a current transmit power, the transmitter comprising: a plurality of code channel generators and/or code channel encoders; for each code channel generator and/or code channel encoder, a respective digital gain element; a compensation element adapted to apply a set of digital gains to the digital gain elements, the set of digital gains compensating for non-linearities in the transmitter as a function of the current total transmit power such that a desired relationship between code channel powers of said set of code channels after having been combined to produce the output is substantially achieved.

In some embodiments, the compensation element comprises: a memory containing for at least one code channel, a respective pre-set digital gain value for the code channel for each of a plurality of states of the set of code channels, and for a plurality of ranges of total transmit power.

In some embodiments, the compensation element comprises a controller adapted to configure the transmitter to have a selected state of a plurality of states, each state comprising at least one of: a) a selection of a particular set of code channels from a set of available code channels; b) a selection of a particular encoder format for at least one code channel; c) a selection of a particular signal format for at least one code channel; and d) a selection of a particular data rate for at least one code channel; a memory containing for each state, a pre-set digital gain value for each code channel for each of a plurality of ranges of transmit power; wherein for each code channel the controller is adapted to apply the appropriate pre-set digital gain value as a function of the state and total transmit power as one digital gain of said set of digital gains.

In some embodiments, the compensation element is further adapted to determine for at least one code channel a nominal digital gain for each code channel, and to combine a respective gain adjustment with each nominal digital gain value to determine the digital gains to be applied to the digital gain elements for the at least one code channel.

In some embodiments, the compensation element comprises a controller adapted to configure the transmitter to have a selected state of a plurality of states, each state comprising at least one of: a) a selection of a particular set of code channels from a set of available code channels; b) a selection of a particular encoder format for at least one code channel; c) a selection of a particular signal format for at least one code channel; and d) a selection of a particular data rate for at least one code channel; a memory containing for each state, the pre-set digital gain adjustment for each code channel for each of a plurality of ranges of transmit power; wherein for each code channel the controller is adapted to employ an appropriate pre-set digital gain adjustment as a function of the state and total transmit power as said respective gain adjustment.

In some embodiments, the transmitter further comprises: a power control subsystem adapted to determine the total transmit power.

Other embodiments provide a computer readable medium having instructions stored thereon which instruct a computer to execute any of the methods summarized above. For example, one broad aspect of the invention provides a computer readable medium comprising computer readable instructions for implementing a method comprising: determining a current total transmit power for an output; determining a set of digital gains in response to the current total transmit power, the set of digital gains setting relative powers of a set of code channels and also compensating for non-linearities in a transmitter as a function of the current total transmit power such that a desired relationship between channel powers of said set of channels after having been combined to produce the output is substantially achieved.

Other aspects and features of the present invention will become apparent, to those ordinarily skilled in the art, upon review of the following description of the specific embodiments of the invention.

BRIEF DESCRIPTION OF THE DRAWINGS

The invention will now be described in greater detail with reference to the accompanying diagrams, in which.

DETAILED DESCRIPTION OF THE PREFERRED EMBODIMENTS

Many impairments can result in the digital gains being applied to multiple code channels not achieving a desired relationship between the power of each of these channels in the output. One impairment of particular concern is non-linear distortions in the RF amplifier chain, in particular at the power amplifier (PA) stage. It has been conventionally thought that the relative code powers could be determined strictly by comparing the digital gains applied in the digital domain. However, it has now been found that in some implementations the observed power for each code channel at the output relative to the other code channels is dependent upon the total transmit power. In particular, for example in a CDMA wireless handset, it has been observed that relative to other code channels, the FCH power changes with the total transmit power significantly when the SCH is turned on.

Figure 1:
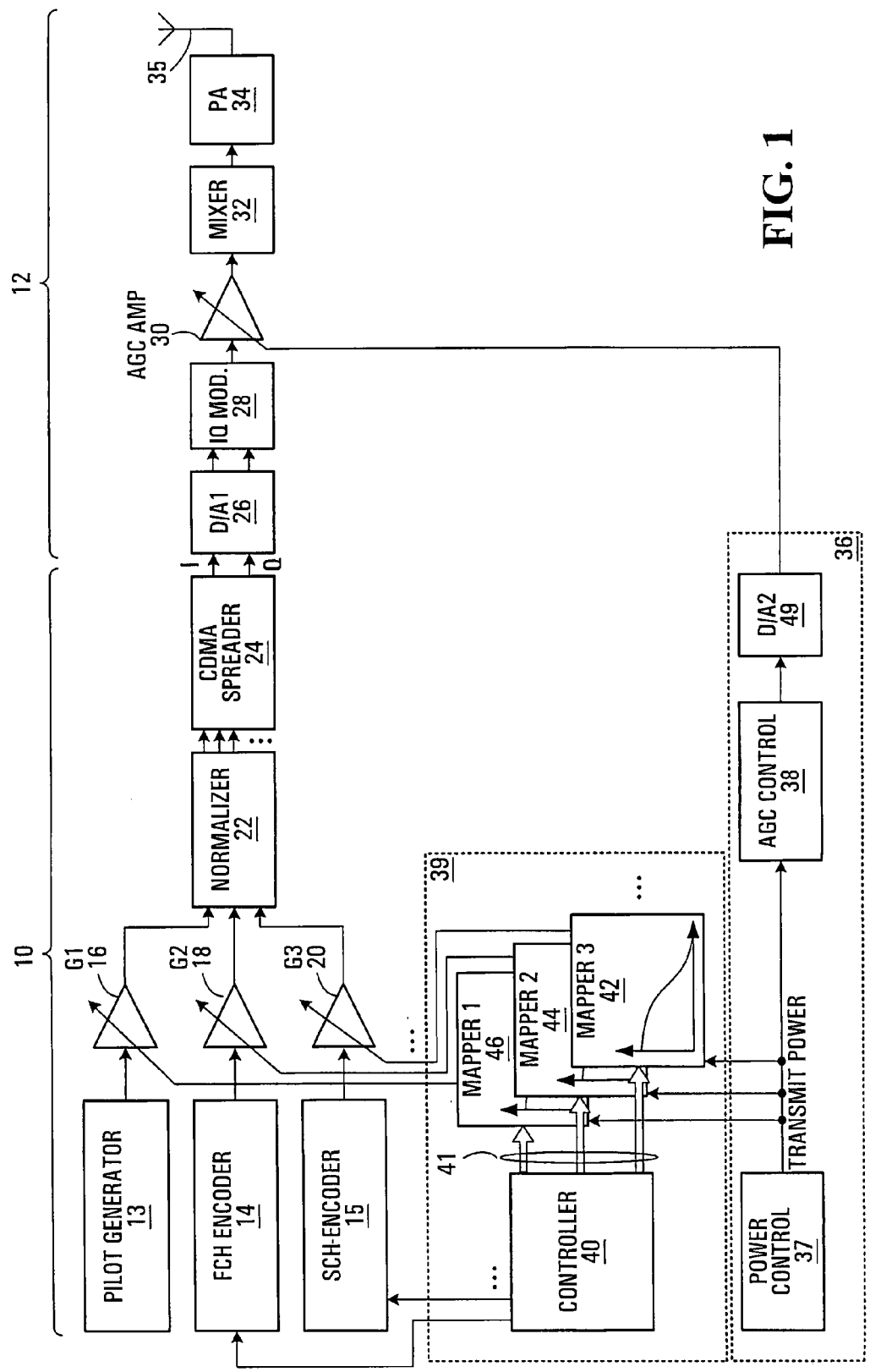
FIG. 1 is a block diagram of a transmitter featuring code channel compensation, as provided by an embodiment of the invention.

Referring now to FIG. 1, shown is a block diagram of a CDMA transmitter featuring code channel power compensation, as provided by an embodiment of the invention. The transmitter includes a digital portion, generally indicated at 10 and an analog portion generally indicated at 12. The digital portion has a set of code channel generators and/or code channel encoders. In the illustrated example, those include a pilot generator 13, a FCH encoder 14, and an SCH encoder 15.

It is to be understood that these particular channels are indicated solely for the purpose of example. Additional or entirely different code channels could alternatively be employed. More generally any set of code channels can be employed that are to be combined such that a desired relationship between output channel powers is achieved.

The output of each code channel generator or code channel encoder is fed to a respective programmable digital gain element. In the illustrated example, the output of pilot generator 13 is passed to programmable digital gain element 16 having gain G1, the output of FCH encoder 14 is passed to programmable digital gain element 18 having gain G2, and the output of SCH encoder 15 is passed to programmable digital gain element 20 having gain G3. The outputs of the digital gain elements are input to a normalizer 22. In embodiments in which the digital gains of the programmable digital gain elements are set to achieve a substantially normalized total combined power or in embodiments where a normalized total combined power is not required, the normalizer 22 would not be required. The output of the normalizer 22 is fed to a CDMA spreader 24 which has I and Q channel outputs fed to digital-to-analog converter 26. At this point the signals enter the analog domain from the digital domain. The analog portion 12 of the transmitter includes an IQ modulator 28, AGC (Automatic Gain Control) amplifier 30, mixer 32, power amplifier 34 and transmit antenna 35.

It is noted that the particular combination of elements in the digital portion 10 and the analog portion 12 are shown by way of example. A given implementation may include different functions in these two portions. For example, in a zero IF design, there would not be any requirement for a mixer.

The transmitter also has a power control subsystem generally indicated by 36. In the illustrated example, the power control subsystem includes a power control function 37 having an output fed to an AGC (Automatic Gain Control) control block 38 which in turn is connected to a digital-to-analog converter 49. The output of the digital-to-analog converter is used to control the gain of the AGC amplifier 30.

It is noted that a very specific example of a power control system is shown in the example. However, more generally any appropriate power control subsystem that produces the desired transmit power values can be employed. This might for example involve open-loop power control, closed-loop power control or a combination of open loop and closed-loop power control.

Also shown is a compensation element 39. In the illustrated example, the compensation element 39 has a controller 40 which is responsible for configuring a current state of the various code channel generators and code channel encoders (elements 13, 14 and 15 in the illustrated examples). This control might for example, include selecting which channels are active, configuring various data rates, encoding formats and signal formats.

For each programmable digital gain element (more generally for at least one programmable digital gain element) there is a mapper which takes the current state and selects a new programmable digital gain value which takes into account the overall transmit power in such a manner to result in the ratios between code channel powers at the output of antenna 35 being substantially equal to the desired ratios notwithstanding non-linearity in the digital portion and/or the analogue portion. In the illustrated example, mapper 1 46 executes a mapping function for the first digital gain element 16, mapper 2 44 executes a second mapping function for the second digital gain element 18, and mapper 3 42 executes a third mapping function for the third digital gain element 20. These mappers 42, 44, 46 operate as a function of a signal generated by the power control subsystem 36 which is representative of the total transmit power. In the illustrated examples, this output is taken after the power control function 37. More generally, any transmit power indicator signal can be employed as an input to the mapping process. State information 41 from the controller is used to reconfigure the mappers each time there is a change in state, or the state can be used every time a new code channel relative power is demanded by the controller and thus a new digital gain value is to be determined by the mappers.

In some embodiments, for any programmable digital gain elements which do not need to be compensated as a function of transmit power, the controller 40 uses a pre-calculated and static digital gain value for the current state of the channel encoders/generators.

The input to each mapper 42,44,46 is the total transmitted power as determined by the power control subsystem 36. The output of each of the mappers varies as a function of the total transmit power at a given current state. The output of each of the mappers controls one of the digital gain elements.

The mapping functions executed by the mappers 42,44,46 are typically non-linear, having been determined by calibration and/or characterization.

Figure 2:
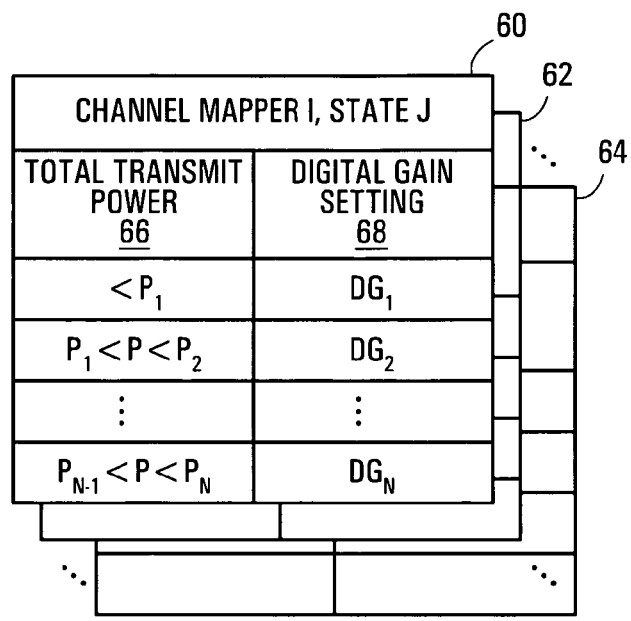
FIG. 2 is an example of a channel mapper table structure for use with the embodiment of FIG. 1.

An example of a mapper structure is shown in FIG. 2. A first table 60 is shown for the Ith channel and a Jth state for the set of channels, for example a particular selected active set, and/or a particular encoding and/or signal format and/or particular data rates. Additional tables are indicated at 62, 64, for the same channel for other states of the set of active channels. In one embodiment, the outputs 41 from the controller 40 are used to select the appropriate table to use at a given instance. Then, the mapping will simply be a direct mapping from the total transmit power indicated at 66 to the digital gain setting indicated at 68. For example, in table 60, shown are entries for total transmit powers for $P \leq P_1, P_1 < P \leq P_2, \ldots P_{N-1} < P \leq P_N$. Respective corresponding digital gain settings 68 are indicated at $DG_1, DG_2, \ldots DG_N$. For a given current total transmit power, the pre-set value for the range containing that current total transmit power is selected.

In typical implementations, the channel state will not change frequently. A table can be loaded for each mapper for the current state, and this table does not need to be re-loaded until the state changes.

In the above example, each state can be considered to be a corresponding set of characteristics for which a different mapping function is required. Any characteristic or characteristics can be employed as a basis for different mapping tables. For example, in some embodiments the state may also include a particular set of values of the desired ratios in power between the active code channels.

The compensation element 39 of FIG. 1 is a very specific example. More generally, any compensation element can be employed which is adapted to apply a set of digital gains to the digital gain elements, the set of digital gains compensating for non-linearities in the transmitter as a function of the current total transmit power such that a desired relationship between channel powers of said set of channels after having been combined to produce the final output is substantially achieved.

Figure 3:
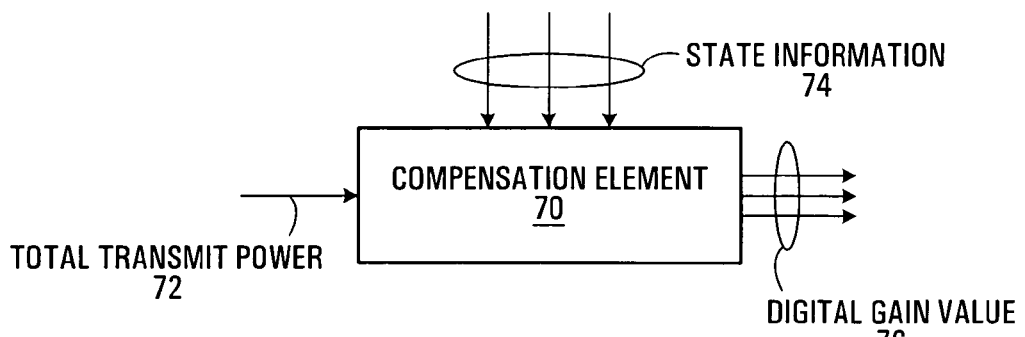
FIG. 3 a block diagram of a compensation element for performing channel compensation, provided by another embodiment of the invention.

More generally, another embodiment of the invention operates as illustrated in FIG. 3. A compensation element is shown indicated generally at 70. This element 70 receives as input the total transmit power indicated at 72, state information indicated at 74, and outputs digital gain values 76. In this embodiment, the state information 74 is any information necessary to enable compensation element 70 to determine appropriate digital gains 76 as a function of the total transmit power 72 such that a desired relationship between channel powers after being combined to produce the transmitter output is substantially achieved. In the above-described example, the operation performed was a table-look-up operation; the state information was an identification of one or more code channels, encoder information and/or a signal formatting information, and data rate information. The digital gain values 76 are compensated digital gain values determined by the compensation element 70 such that the desired interrelationship between the output code channel power is achieved.

As discussed above, the compensation element can perform a table-look-up in which there is a mapping for each channel and for each channel state from various ranges of channel total transmit power to a respective digital gain setting. This is the specific example discussed above with respect to FIG. 2. In another example, each channel has a respective table which maps ranges of total transmit power to digital gain setting for each of a plurality of states, with each state having a column in a table.

In another embodiment, a non-linear continuous function can be implemented in the compensation element 70. Such a non-linear function might be identified by using curve-fitting operations. In other embodiments, the compensation element employs stored pre-set values and uses interpolation to reduce the number of values that need to be stored.

Figure 4:
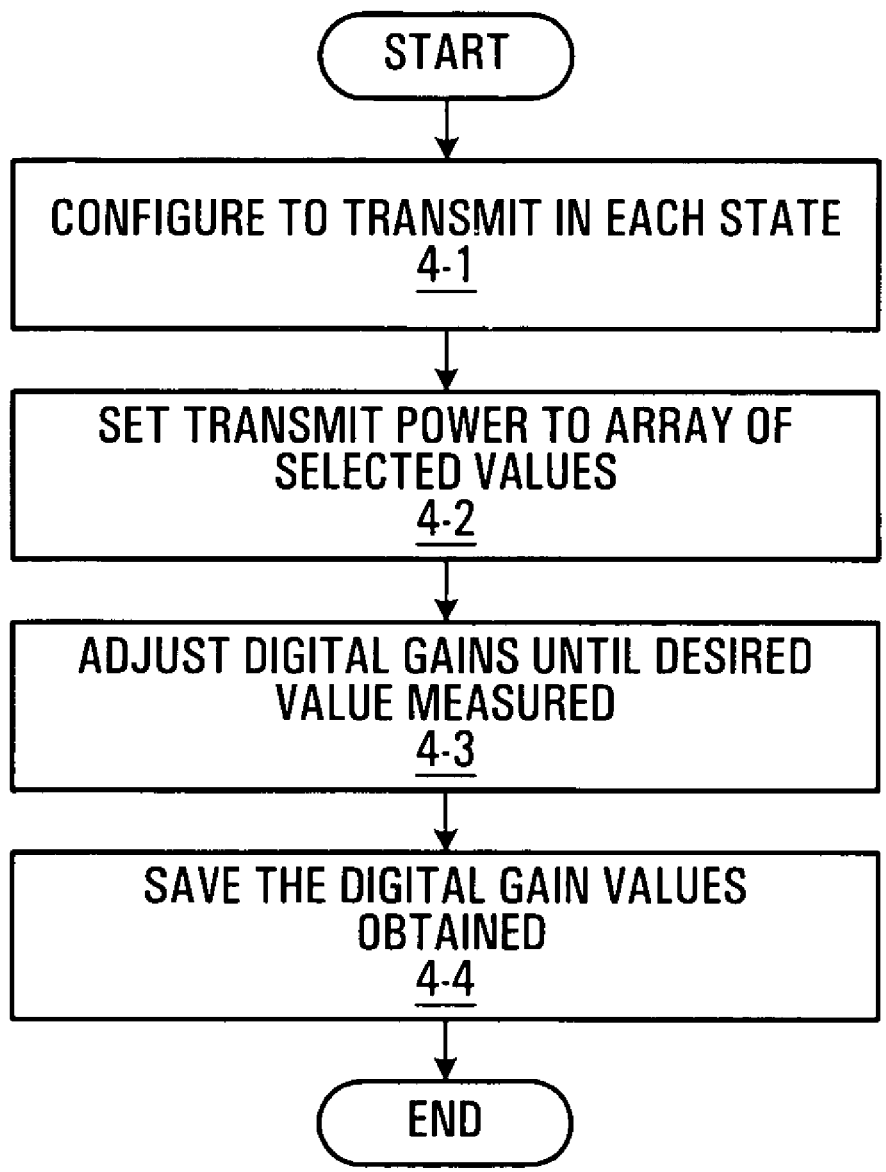
FIG. 4 is a flowchart of an example method of determining pre-set digital gains.

Referring now to FIG. 4 shown is an example flow chart of a method for calibrating tables for use in the embodiment of FIG. 1. This calibration may be performed for each device manufactured during manufacturing, in the event that unit-to-unit variation is significant and cannot be ignored. In the event that a given batch of units do not have significant unit-to-unit variation, calibration could be performed on a per batch level.

The method begins at step 4-1 with configuring the unit to transmit in each of the supported states. The method continues at step 4-2 with setting the transmit power to each of an array of pre-selected values in a range of supported transmit power. This step is done for each state configured in step 4-1. Next, at step 4-3, for each state, and for each selected transmit power, while measuring the code channel powers at the transmitter output port, the digital gains of all of the activated code channels are adjusted until the desired values are measured at the output port. Next, at step 4-4, the digital gain values thus obtained are saved. These values may be directly used to generate tables, or alternatively they can be processed for example by interpolation or to generate appropriate ranges, with the output of the processing being used to fill the tables.

In the event that the unit to unit variation is negligible, a number of sample units can be calibrated as above to find table values for each of the sample units, and an average of the table values thus obtained used in the batch of units.

In the example described above with reference to FIG. 1 it has assumed that for a given set of channels and configurations, the nominal relative code channel output powers desired are fixed or at least not changed often. Because of this, the controller 40 does not generate digital gain values, but rather simply selects an appropriate one of the tables to be used in generating each of the digital gain values. In another embodiment, the desired code channel powers relative to each other are also required to be variable during transmission for at least one of the channels. An example of a method/apparatus of performing non-linear compensation in such a context will now being described with reference to FIG. 5. This figure is the same as FIG. 1 with the exception of the fact that the compensation element 39 is different. In this embodiment, the controller 40 generates an output to select an appropriate mapping table, as indicated at 41. This is substantially the same function as was performed by FIG. 1. However, in this embodiment, the controller also generates variable nominal gains 80 for at least one of the channels, and in the illustrated example for all of the channels. The variable gain value is then combined with an output of the appropriate mapping function to provide an actual gain which is then fed to the appropriate digital gain element. The mapping functions output gain adjustments in this embodiment. In the illustrated example, it is assumed that the variable digital gains are logarithmic, and the values output by the mapping functions are also logarithmic offsets, and as such the two values can simply be added with adders 81, 82 and 83 to get the desired digital gains. In this case, it would be of course assumed that the digital gain blocks accept logarithmic inputs.

If the digital gain blocks accept inputs in the form of linear values, the adders 81, 82 and 83 are replaced with multipliers, and two linear values produced by the controller 40 and the mapping tables 42, 44, 46 are multiplied together to produce gain values to be input to the digital gain elements.

Figure 5:
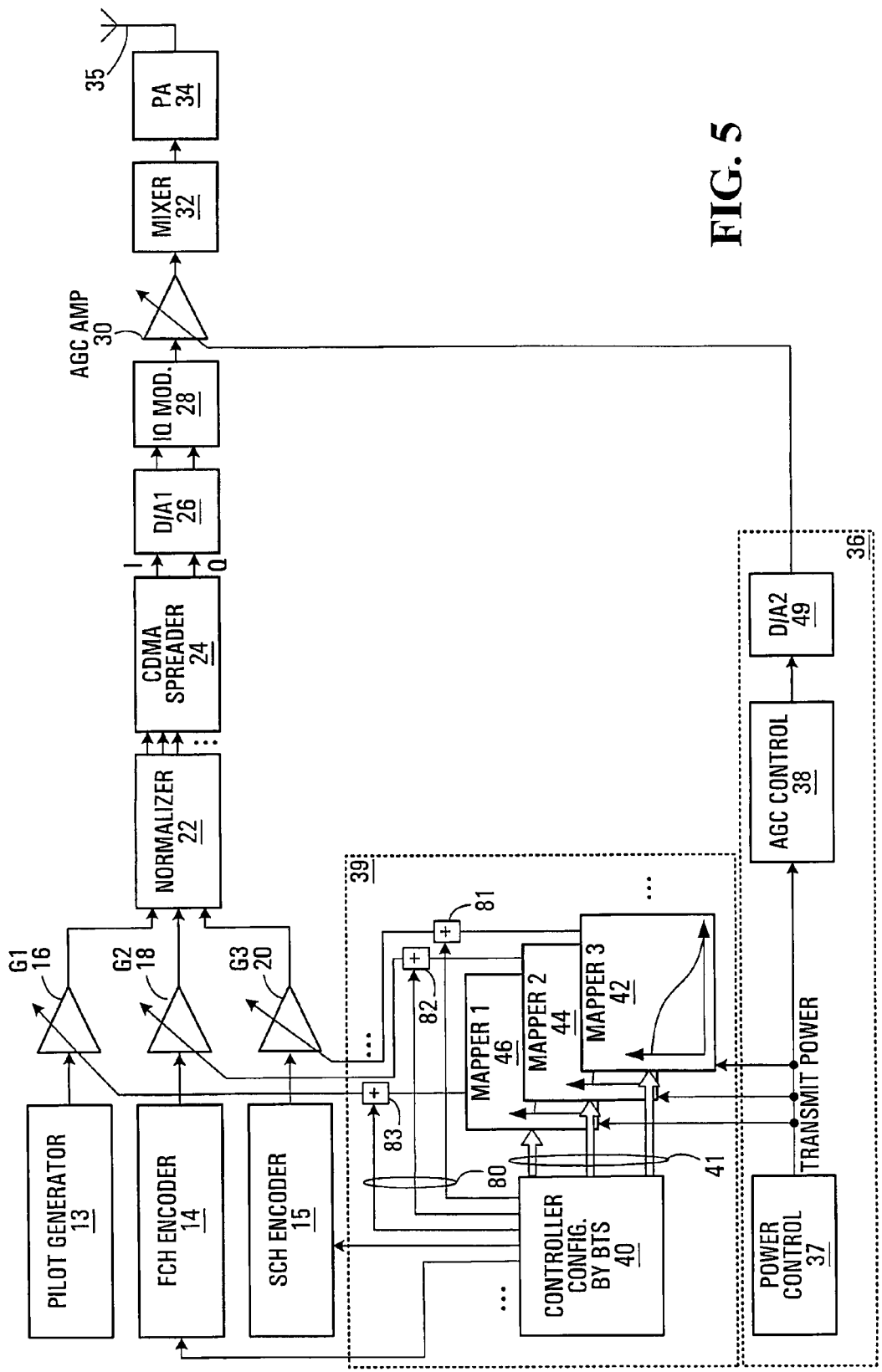
FIG. 5 is a block diagram of another transmitter featuring code channel compensation, as provided by another embodiment of the invention.
Figures 6, 7:
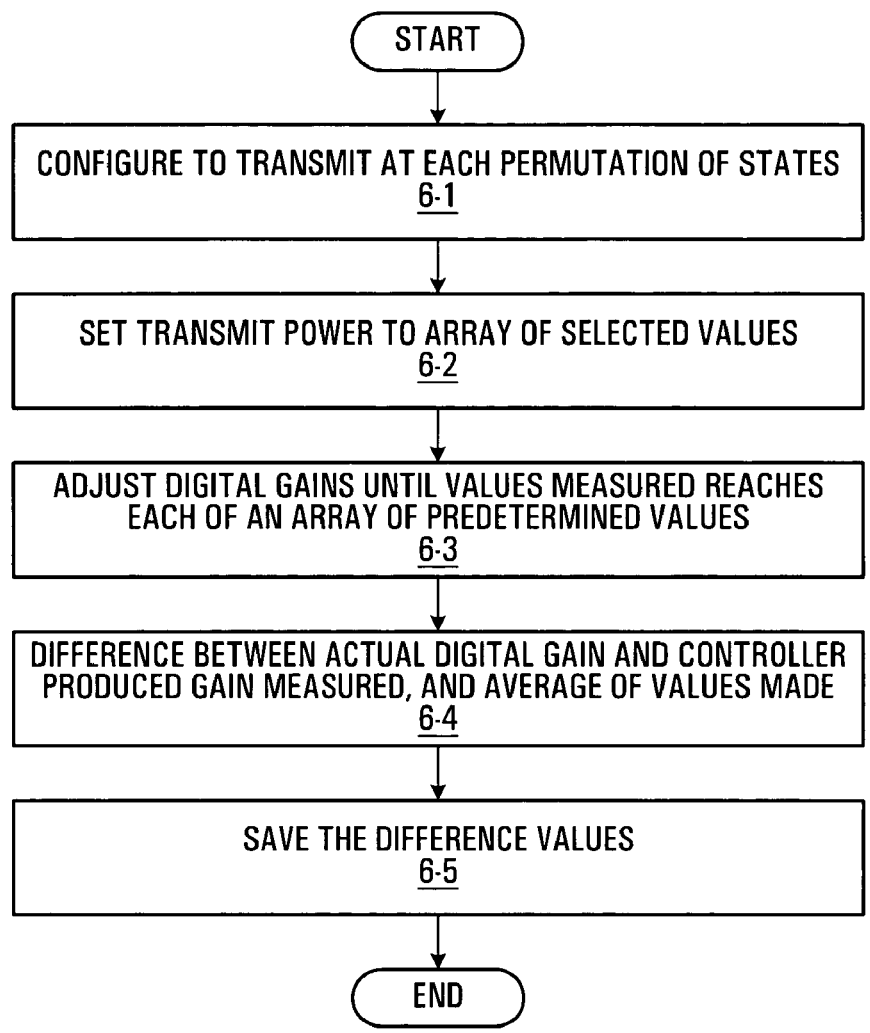
FIG. 6 is a flowchart of an example method of determining gain adjustments.
FIG. 7 is another example of a channel mapper table structure.

An example of a method of calibrating the arrangement of FIG. 5 is now described with reference flowchart of FIG. 6. The method begins at step 6-1 with configuring the unit to transmit at each of the states the unit is capable of operating in. At step 6-2, for each state selected in step 6-1, the transmit power is set to an array of selected values. In step 6-3, for each transmit power and for each state, the digital gains are adjusted until the values measured reach each of an array of predetermined values within the range supported by the given product. This equates to working through the various ranges of nominal gain that could potentially be output by the controller 40 in the example of FIG. 5. At step 6-4, the difference between the actual digital gain after adjustment in accordance with step 6-3, and the controller produced gain is measured and averaged over the multiple adjustments conducted in step 6-3. This average value is then saved at 6-5 and is the value used in generating an appropriate offset for use in the non-linear operation.

Once again, the calibration can be performed on a per unit basis if unit-to-unit variation is significant or for batches if average results are acceptable.

A specific example of performing compensation in the context of variable nominal gains has been described with reference to FIG. 5. It is to be understood that any method/apparatus which compensates for non-linearities as a function of total transmit power can be employed. For example, in another embodiment, for each state, and for each range of total transmit power, a separate mapping table is provided, and a mapping between nominal non-compensated digital gain to compensated digital gain is provided. This increases the number of tables that would be required since there would be a table for each state and each transmit power range. An example of such a table is shown in FIG. 7. This example shows that there is a given table for each state, and for each range of transmit power. The illustrated table is for channel mapper I, state number J and for $P_0 < P \leq P_1$. The nominal gain 80 is mapped to a compensated gain 82.

It is noted that in the above examples, it is assumed that the power in all of the coded channels varies significantly over transmit power. More generally, in some embodiments it may be that one or more of code channels have a power which does not varies significantly from transmit power, and as such it will not be necessary to perform an adjustment of the digital gain being applied for that channel.

Another embodiment of the invention provides a computer readable medium having instructions thereon for implementation by a computer, a computer being any appropriate combination of processing hardware. The instructions are for implementing any of the code channel compensation methods described herein.

What has been described is merely illustrative of the application of the principles of the invention. Other arrangements and methods can be implemented by those skilled in the art without departing from the spirit and scope of the present invention.

The invention claimed is:

1. A method in a transmitter having an output comprising:
   determining a current total transmit power for the output;
   determining a set of digital gains in response to the current total transmit power;
   applying the set of digital gains to a corresponding set of code channels, the set of digital gains setting relative powers of the set of code channels and also compensating for non-linearities in the transmitter as a function of the current total transmit power such that a desired relationship between channel powers of said set of channels after having been combined to produce the output is substantially achieved;
   combining the set of channels to produce the output.

2. A method according to claim 1 wherein the desired relationship between channel powers comprises a specified relative power for each of the channels in the output.

3. A method according to claim 1 further comprising for each of at least one channel:
   maintaining a respective pre-set digital gain value for the channel for each of a plurality of states of the set of channels, and as a function of total transmit power;
   wherein the digital gain to be applied to the channel as part of said set of digital gains comprises the pre-set digital gain for the current state of the set of channels, and for the current total transmit power.

4. A method according to claim 3 wherein for each of said at least one channel, a respective pre-set digital gain is maintained for each of the plurality of states of the set of channels and for a plurality of ranges of total transmit power.

5. A method according to claim 4 further comprising for each code channel:
   maintaining a respective pre-set digital gain value for the code channel for each of a plurality of states of the set of code channels, and for each of a plurality of ranges of total transmit power;
   wherein the digital gain to be applied to the code channel as part of said set of digital gains comprises the pre-set digital gain for a current state of the set of code channels, and for the range containing the current total transmit power.

6. A method according to claim 3 wherein each state comprises a selection of a particular set of code channels from a set of possible code channels, and a selection of at least one of an encoding format, a signal format, and a data rate for at least one of the set of particular code channels.

7. A method according to claim 3 wherein each state comprises at least one of:
   a selection of a particular set of code channels from an available set;
   a selection of a particular encoder format for at least one code channel;
   a selection of a particular signal format for at least one code channel; and
   a selection of a particular data rate for at least one code channel.

8. A method according to claim 4 comprising:
   for each state and for each code channel:
   maintaining the pre-set digital gains in a table mapping each range of transmit power to a respective pre-set digital gain.

9. A method according to claim 1 wherein, for each of at least one of the code channels determining a digital gain of said set of digital gains comprises:
   determining a nominal digital gain for the code channel;
   determining a gain adjustment for the code channel in response to the current total transmit power;
   combining the nominal digital gain and the gain adjustment to produce the digital gain of said set of digital gains for the code channel.

10. A method according to claim 9 wherein the gain adjustment is a multiplicative gain adjustment and wherein combining the nominal digital gain and the gain adjustment to produce the respective digital gains comprises multiplying the nominal digital gain by the gain adjustment.

11. A method according to claim 9 wherein the gain adjustment is an additive gain adjustment and wherein combining the nominal digital gain and the gain adjustment to produce the respective digital gains comprises adding the nominal digital gain to the gain adjustment.

12. A method according to claim 9 comprising:
    for each state and for each code channel:
    maintaining the gain adjustments in a table mapping each range of transmit power to a respective gain adjustment.

13. A method according to claim 12 wherein each gain adjustment is pre-determined to provide compensation over a range of nominal digital gains.

14. A method according to claim 2 wherein the code channels are CDMA code channels.

15. A transmitter having an output and a current transmit power, the transmitter comprising:
    a plurality of code channel generators and/or code channel encoders;
    for each code channel generator and/or code channel encoder, a respective digital gain element;
    a compensation element adapted to apply a set of digital gains to the digital gain elements, the set of digital gains compensating for non-linearities in the transmitter as a function of the current total transmit power such that a desired relationship between code channel powers of said set of code channels after having been combined to produce the output is substantially achieved.

16. A transmitter according to claim 15 wherein the compensation element comprises:
    a memory containing for at least one code channel, a respective pre-set digital gain value for the code channel for each of a plurality of states of the set of code channels, and for a plurality of ranges of total transmit power.

17. A transmitter according to claim 15 wherein the compensation element comprises a controller adapted to configure the transmitter to have a selected state of a plurality of states, each state comprising at least one of:
    a) a selection of a particular set of code channels from a set of available code channels;
    b) a selection of a particular encoder format for at least one code channel;
    c) a selection of a particular signal format for at least one code channel; and
    d) a selection of a particular data rate for at least one code channel;
    a memory containing for each state, a pre-set digital gain value for each code channel for each of a plurality of ranges of transmit power;
    wherein for each code channel the controller is adapted to apply the appropriate pre-set digital gain value as a function of the state and total transmit power as one digital gain of said set of digital gains.

18. A transmitter according to claim 15 wherein the compensation element is further adapted to determine for at least one code channel a nominal digital gain for the code channel, and to combine a respective gain adjustment with each nominal digital gain value to determine the digital gains to be applied to the digital gain elements for the at least one code channel.

19. A transmitter according to claim 18 wherein the compensation element comprises a controller adapted to configure the transmitter to have a selected state of a plurality of states, each state comprising at least one of:
   a) a selection of a particular set of code channels from a set of available code channels;
   b) a selection of a particular encoder format for at least one code channel;
   c) a selection of a particular signal format for at least one code channel; and
   d) a selection of a particular data rate for at least one code channel;
   a memory containing for each state, the pre-set digital gain adjustment for each code channel for each of a plurality of ranges of transmit power;
   wherein for each code channel the controller is adapted to employ an appropriate pre-set digital gain adjustment as a function of the state and total transmit power as said respective gain adjustment.

20. A transmitter according to claim 15 further comprising:
   a power control subsystem adapted to determine the total transmit power.

21. A computer readable medium comprising computer readable instructions for implementing a method comprising:
   determining a current total transmit power for an output;
   determining a set of digital gains in response to the current total transmit power, the set of digital gains setting relative powers of a set of code channels and also compensating for non-linearities in a transmitter as a function of the current total transmit power such that a desired relationship between channel powers of said set of channels after having been combined to produce the output is substantially achieved.

22. A computer readable medium according to claim 21 wherein the method further comprises for each of at least one channel:
   maintaining a respective pre-set digital gain value for the channel for each of a plurality of states of the set of channels, and as a function of total transmit power;
   wherein the digital gain to be applied to the channel as part of said set of digital gains comprises the pre-set digital gain for the current state of the set of channels, and for the current total transmit power.

23. A computer readable medium according to claim 22 wherein each state comprises a selection of a particular set of code channels from a set of possible code channels, and a selection of at least one of an encoding format, a signal format, and a data rate for at least one of the set of particular code channels.

24. A computer readable medium according to claim 23 wherein, for each of at least one of the code channels determining a digital gain of said set of digital gains comprises:
   determining a nominal digital gain for the code channel;
   determining a gain adjustment for the code channel in response to the current total transmit power;
   combining the nominal digital gain and the gain adjustment to produce the digital gain of said set of digital gains for the code channel.

* * * * *